(12) United States Patent
Cao et al.

(10) Patent No.: US 11,735,621 B2
(45) Date of Patent: Aug. 22, 2023

(54) X-RAY DETECTORS BASED ON AN EPITAXIAL LAYER AND METHODS OF MAKING

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 187 days.

(21) Appl. No.: 17/365,392

(22) Filed: Jul. 1, 2021

(65) Prior Publication Data

US 2021/0327950 A1    Oct. 21, 2021

Related U.S. Application Data

(63) Continuation of application No. PCT/CN2019/071118, filed on Jan. 10, 2019.

(51) Int. Cl.
*H01L 27/146* (2006.01)
*G01T 1/20* (2006.01)
*G01N 23/223* (2006.01)

(52) U.S. Cl.
CPC ..... *H01L 27/14663* (2013.01); *G01N 23/223* (2013.01); *G01T 1/20181* (2020.05)

(58) Field of Classification Search
CPC ............ H01L 27/14663; G01N 23/223; G01T 1/20181
See application file for complete search history.

(56) References Cited

U.S. PATENT DOCUMENTS

| 10,056,425 B2 | 8/2018 | Cao et al. |
| 2004/0007671 A1 | 1/2004 | Sipila et al. |
| 2009/0181491 A1 | 7/2009 | Roizin et al. |
| 2010/0314651 A1* | 12/2010 | Lin .................. H01L 33/62 257/E33.002 |

(Continued)

FOREIGN PATENT DOCUMENTS

| CN | 1627099 A | 6/2005 |
| CN | 103296036 A | 9/2013 |

(Continued)

OTHER PUBLICATIONS

Moser et al: "Silicon detector systems in 1-8 high energy physics", Progress in Particle and Nuclear Physics, Pergamon, Amsterdam, NL, vol. 63, No. 1, Jul. 1, 2009 (Jul. 1, 2009), pp. 186-237, XP026133580, ISSN: 0146-6410, DOI: 10.1016/J.PPNP.2008.12.002.

*Primary Examiner* — Kiho Kim
(74) *Attorney, Agent, or Firm* — IPro, PLLC; Qian Gu

(57) ABSTRACT

Disclosed herein is a method comprising: forming electrical contacts on a first surface of an epitaxial layer supported on a substrate, the first surface being opposite from the substrate; bonding the epitaxial layer to an electronics layer, wherein the first surface faces the electronics layer and the electrical contacts on the first surface are bonded to electrical contacts of the electronics layer; exposing a second surface opposite the first surface by removing the substrate; and forming a common electrode on the second surface.

16 Claims, 20 Drawing Sheets

(56) References Cited

U.S. PATENT DOCUMENTS

| | | | | |
|---|---|---|---|---|
| 2012/0104534 A1* | 5/2012 | Lee | ............... | H01L 27/14632 |
| | | | | 257/E31.032 |
| 2016/0049351 A1* | 2/2016 | McCann | ............... | H01L 24/83 |
| | | | | 438/122 |
| 2017/0055923 A1* | 3/2017 | Meylan | ............... | A61B 6/032 |
| 2017/0097468 A1* | 4/2017 | Czornomaz | ............... | G02B 6/13 |

FOREIGN PATENT DOCUMENTS

| | | |
|---|---|---|
| CN | 107710021 A | 2/2018 |
| CN | 108140650 A | 6/2018 |
| CN | 108271415 A | 7/2018 |

\* cited by examiner

Fig. 2C

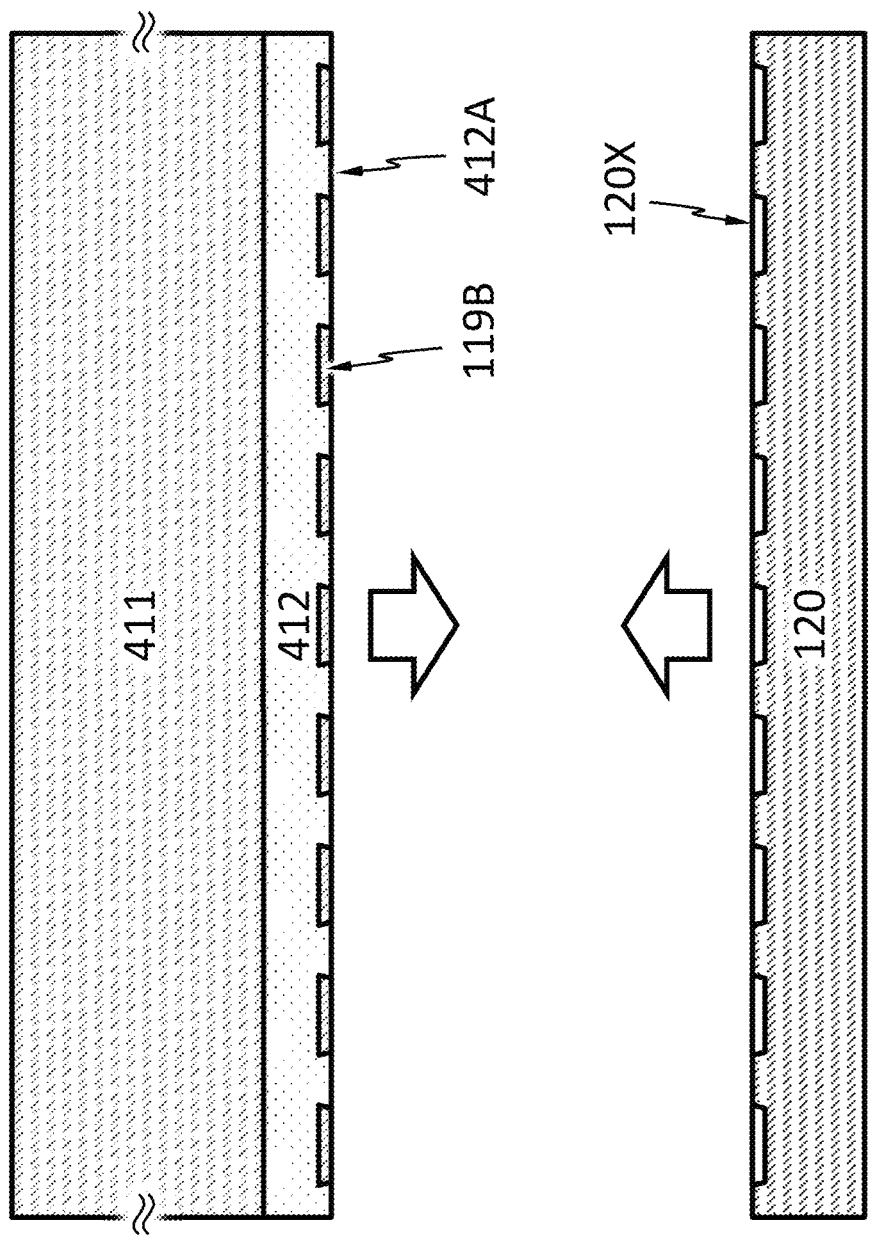

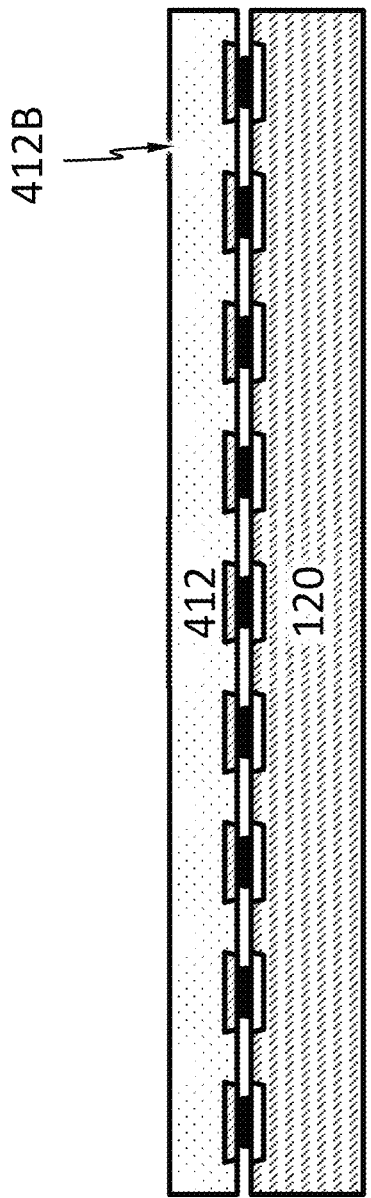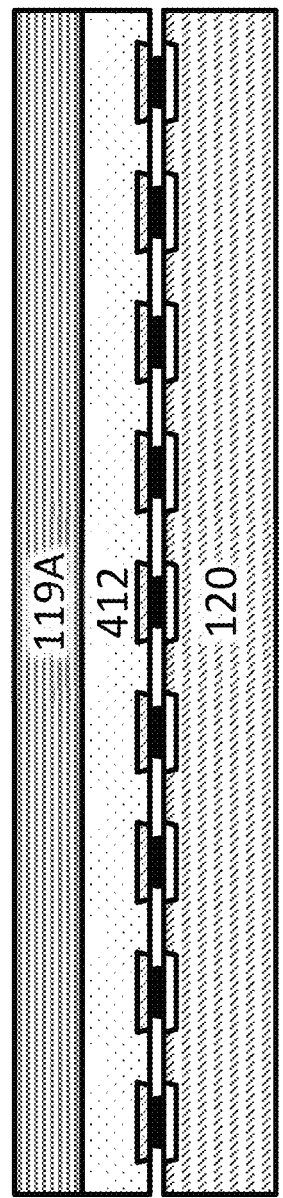
Fig. 10D
Fig. 10E

X-RAY DETECTORS BASED ON AN EPITAXIAL LAYER AND METHODS OF MAKING

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

X-ray fluorescence (XRF) is the emission of characteristic fluorescent X-rays from a material that has been excited by, for example, exposure to high-energy X-rays or gamma rays. An electron on an inner orbital of an atom may be ejected, leaving a vacancy on the inner orbital, if the atom is exposed to X-rays or gamma rays with photon energy greater than the ionization potential of the electron. When an electron on an outer orbital of the atom relaxes to fill the vacancy on the inner orbital, an X-ray (fluorescent X-ray or secondary X-ray) is emitted. The emitted X-ray has a photon energy equal the energy difference between the outer orbital and inner orbital electrons.

For a given atom, the number of possible relaxations is limited. As shown in FIG. 1A, when an electron on the L orbital relaxes to fill a vacancy on the K orbital (L→K), the fluorescent X-ray is called Kα. The fluorescent X-ray from M→K relaxation is called Kβ. As shown in FIG. 1B, the fluorescent X-ray from M→L relaxation is called Lα, and so on.

Some X-ray detectors are suitable for detecting XRF.

SUMMARY

Disclosed herein is a method comprising: forming electrical contacts on a first surface of an epitaxial layer supported on a substrate, the first surface being opposite from the substrate; bonding the epitaxial layer to an electronics layer, wherein the first surface faces the electronics layer and the electrical contacts on the first surface are bonded to electrical contacts of the electronics layer; exposing a second surface opposite the first surface by removing the substrate; and forming a common electrode on the second surface.

According to an embodiment, the method further comprises growing the epitaxial layer onto the substrate.

According to an embodiment, the method further comprises forming a p-n junction or a p-i-n junction in the epitaxial layer during growth thereof.

According to an embodiment, the epitaxial layer comprises a p-n junction or a p-i-n junction.

According to an embodiment, the method further comprises forming a scintillator layer on the common electrode, the scintillator layer being opposite from the epitaxial layer.

According to an embodiment, the scintillator layer comprises porous silicon.

According to an embodiment, the epitaxial layer has a thickness of 1-10 microns.

According to an embodiment, the common electrode comprises a grid.

According to an embodiment, the common electrode comprises silver (Ag) nanowires, carbon nanotubes, graphite, graphene, or any combination thereof.

According to an embodiment, the electronics layer comprises: a first voltage comparator configured to compare a voltage of at least one of the electrical contacts on the first surface to a first threshold; a second voltage comparator configured to compare the voltage to a second threshold; a counter configured to register a number of X-ray photons absorbed by the epitaxial layer; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, upon determination by the second voltage comparator that an absolute value of the voltage equals or exceeds an absolute value of the second threshold.

According to an embodiment, the electronics layer further comprises an integrator electrically connected to the at least one of the electrical contacts on the first surface, wherein the integrator is configured to collect charge carriers from the at least one of the electrical contacts on the first surface.

According to an embodiment, the controller is configured to activate the second voltage comparator at a beginning or expiration of the time delay.

According to an embodiment, the electronics layer further comprises a voltmeter, and the controller is configured to cause the voltmeter to measure the voltage upon expiration of the time delay.

According to an embodiment, the controller is configured to determine energy of an X-ray photon based on a value of the voltage measured upon expiration of the time delay.

According to an embodiment, the controller is configured to connect the at least one of the electrical contacts on the first surface to an electrical ground.

According to an embodiment, the epitaxial layer comprises silicon, germanium, GaAs, CdTe, CdZnTe, or a combination thereof.

Disclosed herein is a method comprising: disposing an analyte onto an X-ray detector, wherein the X-ray detector comprises an epitaxial layer; causing X-ray fluorescence from the analyte; absorbing at least a portion of the X-ray fluorescence by the epitaxial layer; detecting the X-ray fluorescence based on electrical signals the X-ray fluorescence generates in the epitaxial layer.

According to an embodiment, the method further comprises immersing the X-ray detector in a liquid.

According to an embodiment, the analyte comprises a cell, a nucleic acid, a peptide, or any combination thereof.

According to an embodiment, the analyte is disposed directly on the epitaxial layer.

According to an embodiment, the X-ray detector comprises a scintillator layer on the epitaxial layer and the analyte is disposed directly on the scintillator layer.

According to an embodiment, the X-ray detector comprises a common electrode on the epitaxial layer and the analyte is disposed directly on the common electrode.

According to an embodiment, the X-ray detector comprises an electronics layer and wherein the epitaxial layer is bonded to the electronics layer.

According to an embodiment, the X-ray detector comprises electrical contacts on a first surface of the epitaxial layer, the first surface facing the electronics layer; wherein the electronics layer comprises electrical contacts; wherein the electrical contacts on the first surface are bonded to the electrical contacts of the electronics layer.

According to an embodiment, the epitaxial layer comprises a p-n junction or a p-i-n junction.

BRIEF DESCRIPTION OF FIGURES

FIG. 2C shows an exemplary top view of a portion of the X-ray detector in FIG. 2A or FIG. 2B, according to an embodiment.

FIG. 10A-FIG. 10F schematically show a method of making the X-ray detector, according to an embodiment.

DETAILED DESCRIPTION

Figure 1A:
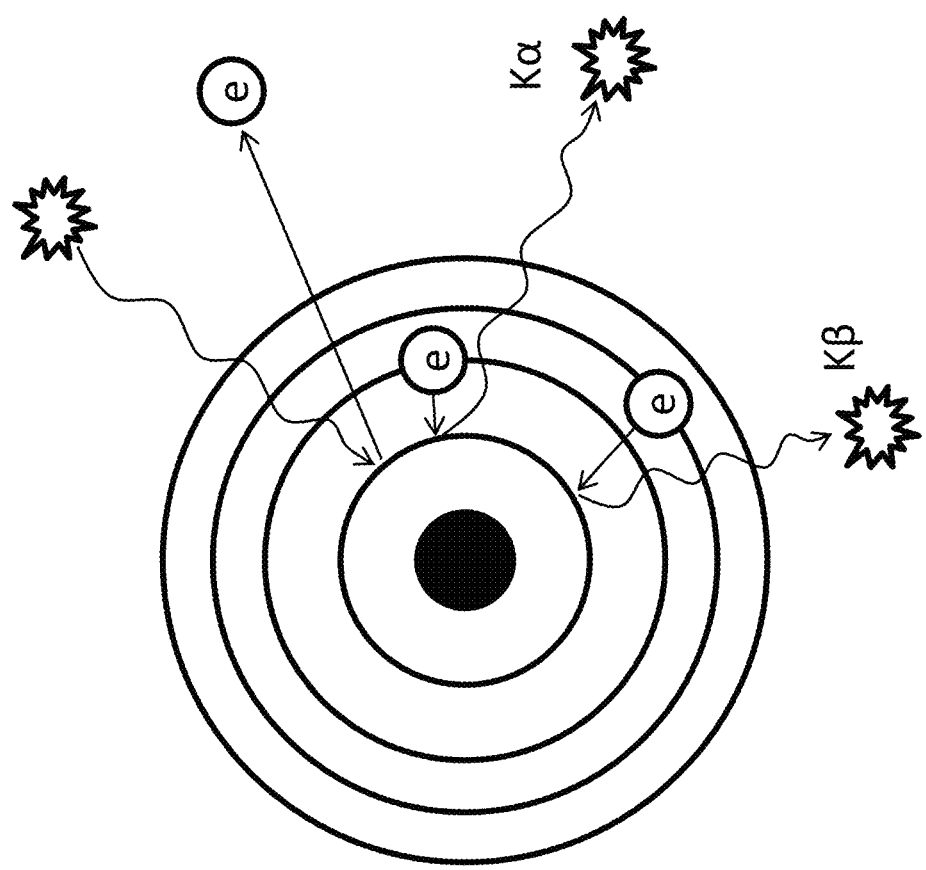
FIG. 1A and FIG. 1B schematically show mechanisms of XRF.
Figure 1B:
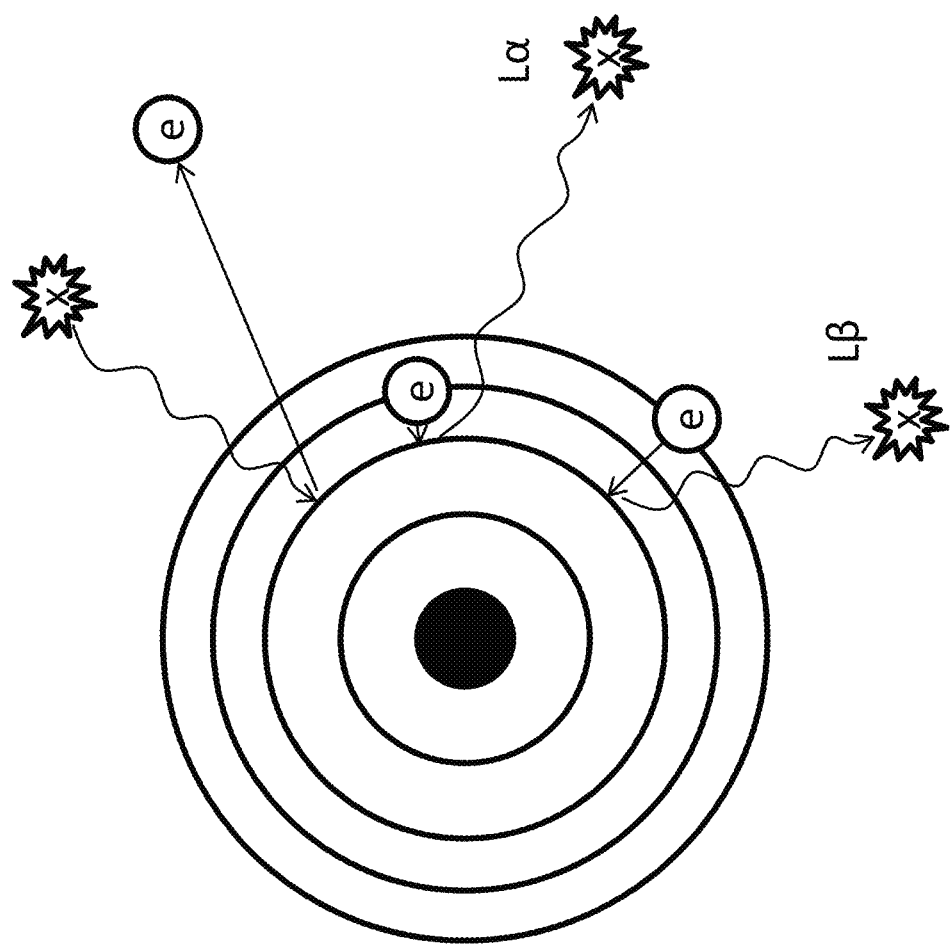
Figure 2A:
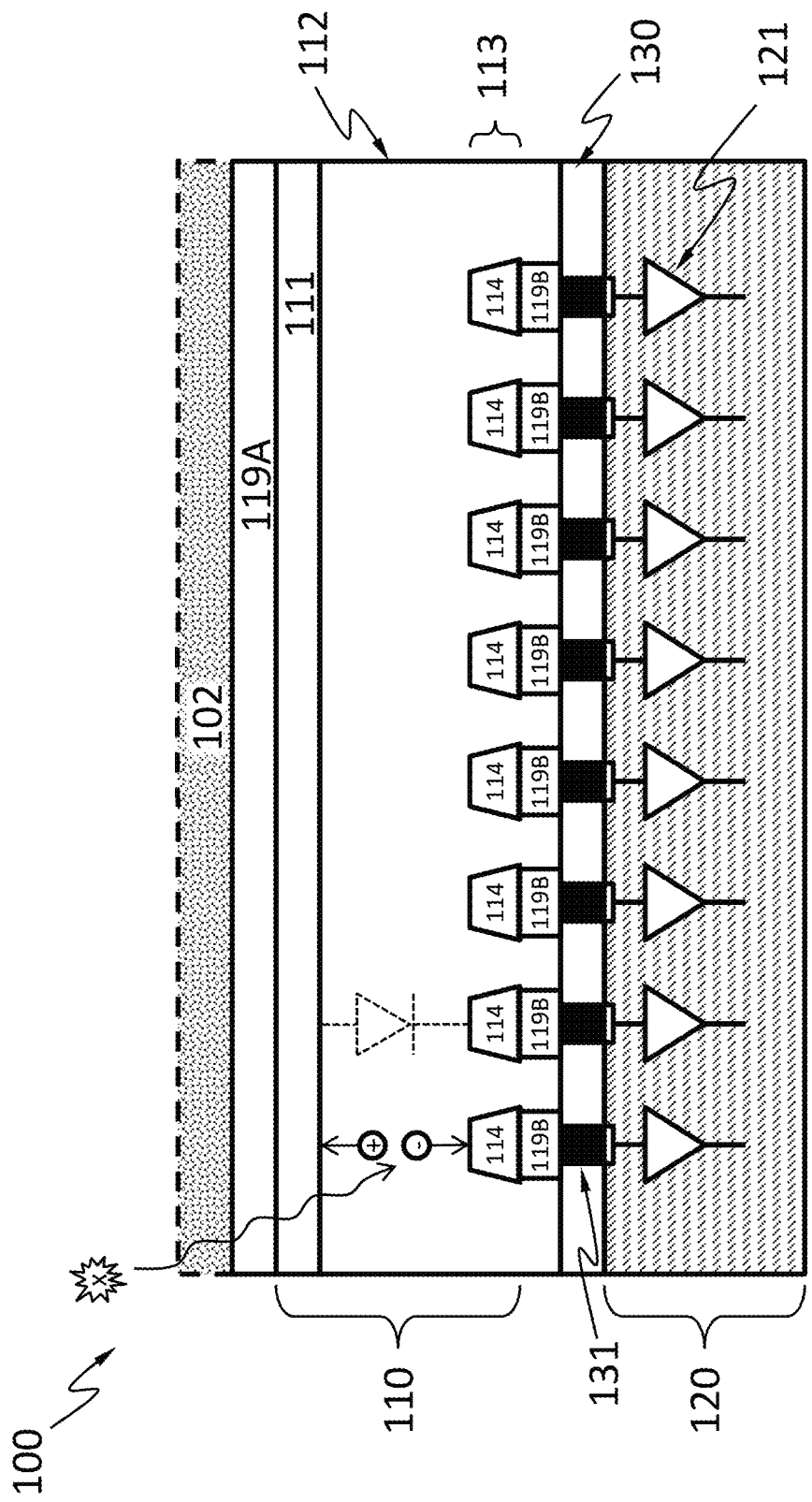
FIG. 2A schematically shows an X-ray detector, according to an embodiment.

FIG. 2A schematically shows an X-ray detector 100, according to an embodiment. The X-ray detector 100 may include an X-ray absorption layer 110 and an electronics layer 120 (e.g., an ASIC or CMOS layer) for processing or analyzing electrical signals incident X-ray generates in the X-ray absorption layer 110. In an embodiment, the X-ray detector 100 may comprise a scintillator layer 102 on top of the X-ray absorption layer 110. The scintillator layer 102 may include porous silicon. The scintillator layer 102 may be optional and not implemented in at least some embodiments. The X-ray absorption layer 110 includes an epitaxial layer that may be previously supported on a substrate. The epitaxial layer and the substrate are both crystalline and the epitaxial layer has a well-defined orientation with respect to the crystal structure of the substrate. The epitaxial layer may be formed by epitaxy growth, such as, but not limited to, vapor-phase epitaxy (VPE), chemical vapor deposition (CVD), molecular-beam epitaxy (MBE) or liquid-phase epitaxy (LPE). The epitaxial layer may include a semiconductor material such as, silicon, germanium, GaAs, CdTe, CdZnTe, or a combination thereof. The semiconductor material may have a high mass attenuation coefficient for the X-ray energy of interest (e.g., several keV). In one embodiment, the epitaxial layer may be about 1-10 microns thick or 5-10 microns thick.

The X-ray absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 2A, each of the discrete regions 114 of the second doped region 113 forms a diode with the first doped region 111 and the optional intrinsic region 112. Namely, in the example in FIG. 2A, the X-ray absorption layer 110 has a plurality of diodes having the first doped region 111 as a shared electrode. The first doped region 111 may also have discrete portions.

Figure 2B:
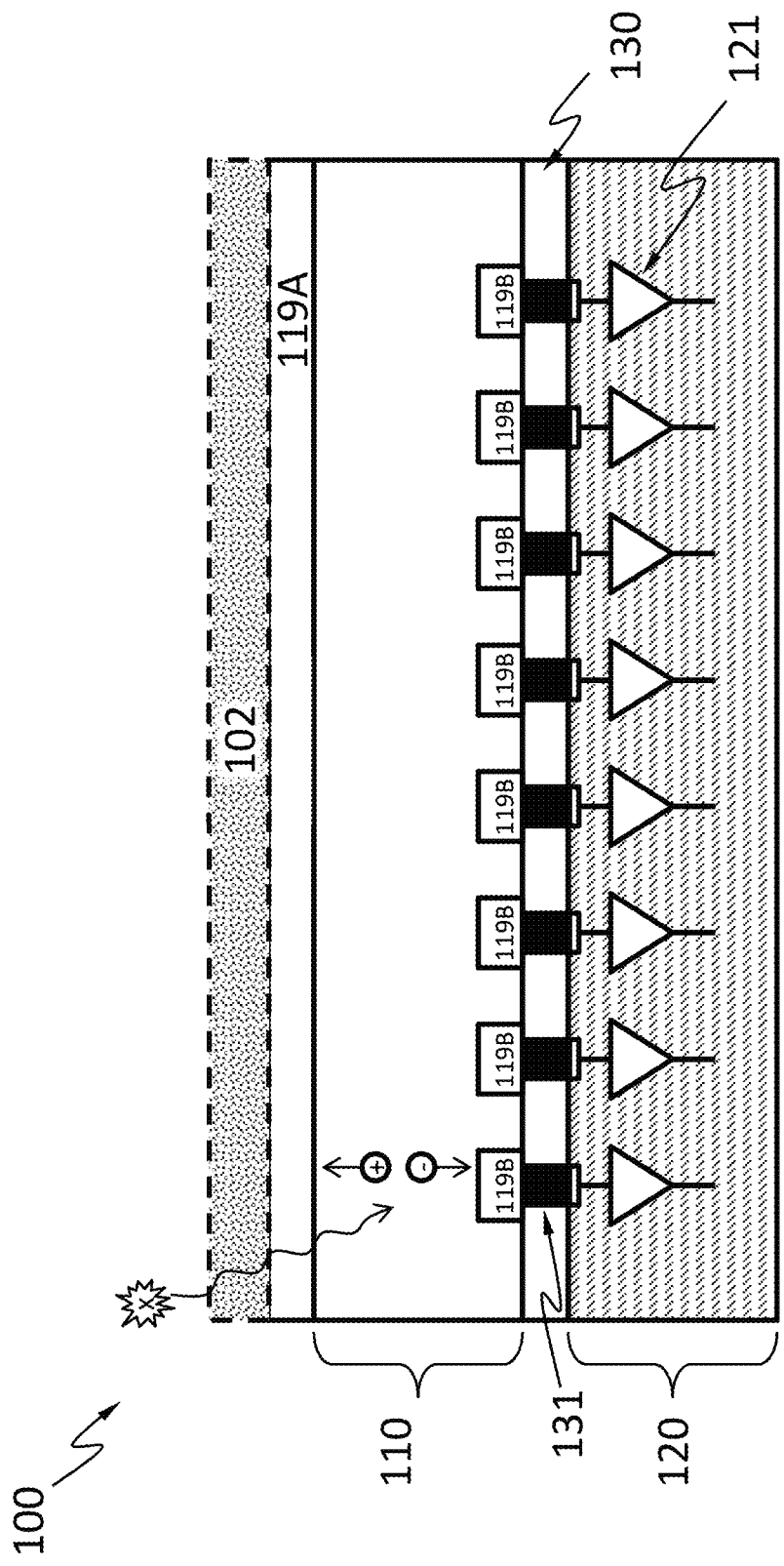
FIG. 2B schematically shows an X-ray detector, according to an embodiment.

FIG. 2B shows a cross sectional view of the X-ray detector 100, according to an embodiment. The X-ray detector 100 may include an X-ray absorption layer 110 and an electronics layer 120 (e.g., an ASIC or CMOS layer) for processing or analyzing electrical signals incident X-ray generates in the X-ray absorption layer 110. In an embodiment, the X-ray detector 100 may comprise a scintillator layer 102 on top of the X-ray absorption layer 110. The scintillator layer 102 may include porous silicon. The scintillator layer 102 may be optional and not implemented in at least some embodiments. The X-ray absorption layer 110 includes an epitaxial layer that may be previously supported on a substrate. The epitaxial layer and the substrate are both crystalline and the epitaxial layer has a well-defined orientation with respect to the crystal structure of the substrate. The epitaxial layer may be formed by epitaxy growth, such as, but not limited to, vapor-phase epitaxy (VPE), chemical vapor deposition (CVD), molecular-beam epitaxy (MBE) or liquid-phase epitaxy (LPE). The epitaxial layer may include a semiconductor material such as, silicon, germanium, GaAs, CdTe, CdZnTe, or a combination thereof. The semiconductor material may have a high mass attenuation coefficient for the X-ray energy of interest (e.g., several keV). The X-ray absorption layer 110 may not include a diode but includes a resistor. In one embodiment, the epitaxial layer may be about 1-10 microns thick or 5-10 microns thick.

Figure 2C:
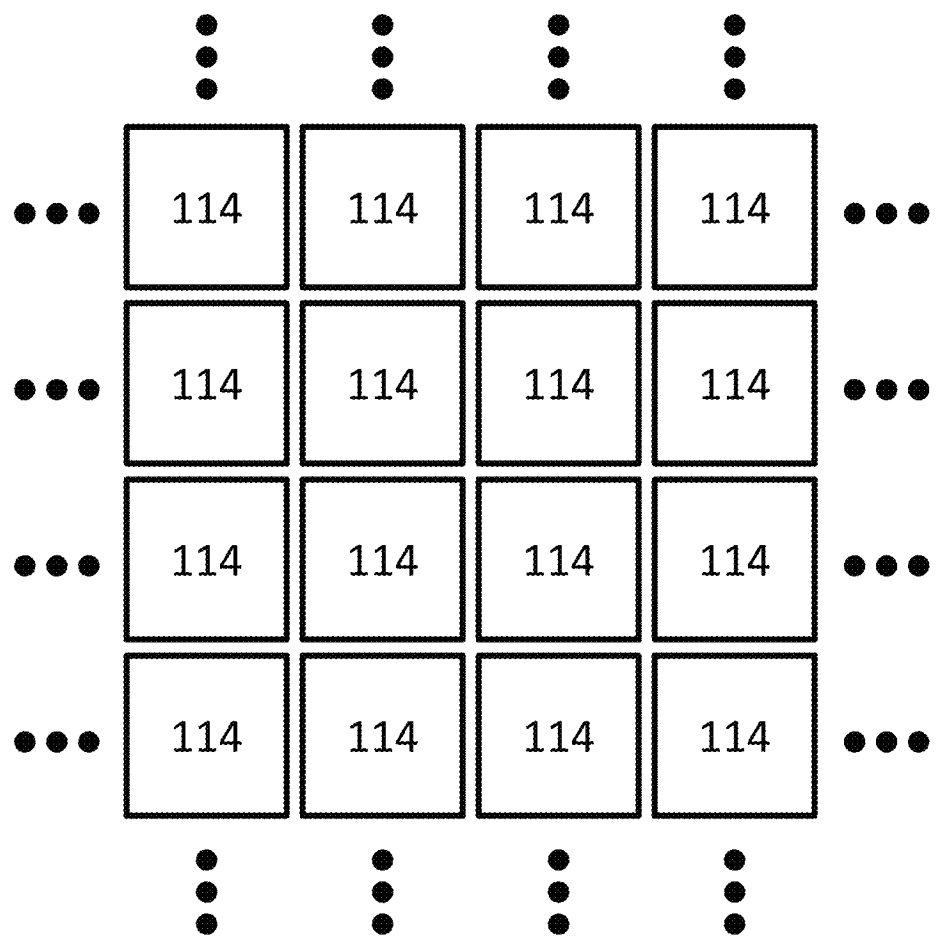

When an X-ray photon hits the X-ray absorption layer 110 including diodes, it may be absorbed and generate one or more charge carriers by a number of mechanisms. An X-ray Photon may generate 10 to 100000 charge carriers. The charge carriers may drift to a common electrode 119A and the electrical contacts 119B under an electric field. The electrode 119A may include a grid or may include conductive materials, such as, but not limited to, silver (Ag) nanowire, carbon nanotube (CNT), carbon, graphite, graphene or any of their combination. The field may be an external electric field. Electrical contacts 119B may each be in electrical contact with the discrete regions 114 and the charge carriers may drift to the electrical contacts 119B through the discrete regions 114. In an embodiment, the charge carriers may drift in directions such that the charge carriers generated by a single X-ray photon are not substantially shared by two different discrete regions 114 ("not substantially shared" here means less than 5%, less than 2% or less than 1% of these charge carriers flow to a different one of the discrete regions 114 than the rest of the charge carriers). In an embodiment, the charge carriers generated by a single X-ray photon can be shared by two different discrete regions 114. FIG. 2C shows an exemplary top view of a portion of the X-ray detector 100 with a 4-by-4 array of discrete regions 114. Charge carriers generated by an X-ray photon incident around the footprint of one of these discrete regions 114 are not substantially shared with another of these discrete regions 114. The area around a discrete region 114 in which substantially all (more than 95%, more than 98% or more than 99% of) charge carriers generated by an X-ray photon incident therein flow to the discrete region 114 is called a pixel associated with that discrete region 114. Namely, less than 5%, less than 2% or less than 1% of these charge carriers flow beyond the pixel. By measuring the drift current flowing into each of the discrete regions 114, or the rate of change of the voltage of each of the discrete regions 114, the number of X-ray photons absorbed (which relates to the incident X-ray intensity) and/or the energies thereof in the pixels associated with the discrete regions 114 may be determined. Thus, the spatial distribution (e.g., an image) of incident X-ray intensity may be determined by individually measuring the drift current into each one of an array of discrete regions 114 or measuring the rate of change of the voltage of each one of an array of discrete regions 114. The pixels may be organized in any suitable array, such as, a square array, a triangular array and a honeycomb array. The pixels may have any suitable shape, such as, circular, triangular, square, rectangular, and hexangular. The pixels may be individually addressable.

When an X-ray photon hits the X-ray absorption layer 110 including a resistor but not diodes, it may be absorbed and generate one or more charge carriers by a number of mechanisms. An X-ray photon may generate 10 to 100000 charge carriers. The charge carriers may drift to a common electrode 119A and the electrical contacts 119B under an electric field. The electrode 119A may include a grid or may include conductive materials, such as, but not limited to, silver (Ag) nanowire, carbon nanotube (CNT), carbon, graphite, graphene or any of their combination. The field may be an external electric field. In an embodiment, the charge carriers may drift in directions such that the charge carriers generated by a single X-ray photon are not substantially shared by two different electrical contacts 119B ("not substantially shared" here means less than 5%, less than 2% or less than 1% of these charge carriers flow to a different one of the electrical contacts 119B than the rest of the charge carriers). In an embodiment, the charge carriers generated by a single X-ray photon can be shared by two different electrical contacts 119B. Charge carriers generated by an X-ray photon incident around the footprint of one of the electrical contacts 119B are not substantially shared with another one of the electrical contacts 119B. The area around one of the electrical contacts 119B in which substantially all (more than 95%, more than 98% or more than 99% of) charge carriers generated by an X-ray photon incident therein flow to that one electrical contact 119B is called a pixel associated with that one electrical contact 119B. Namely, less than 5%, less than 2% or less than 1% of these charge carriers flow beyond the pixel associated with that one electrical contact 119B. By measuring the drift current flowing into each of the electrical contacts 119B, or the rate of change of the voltage of each of the electrical contacts 119B, the number of X-ray photons absorbed (which relates to the incident X-ray intensity) and/or the energies thereof in the pixels associated with the electrical contacts 119B may be determined. Thus, the spatial distribution (e.g., an image) of incident X-ray intensity may be determined by individually measuring the drift current into each one of an array of the electrical contacts 119B or measuring the rate of change of the voltage of each one of an array of the electrical contacts 119B. The pixels may be organized in any suitable array, such as, a square array, a triangular array and a honeycomb array. The pixels may have any suitable shape, such as, circular, triangular, square, rectangular, and hexangular. The pixels may be individually addressable.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessor, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias. After bonding, the electrical contacts 119B may be bonded to electrical contacts of the electronics layer 120. In an embodiment, the electronic system 121 may be configured to not sense XRF from materials in the X-ray absorption layer 110.

Figure 3A:
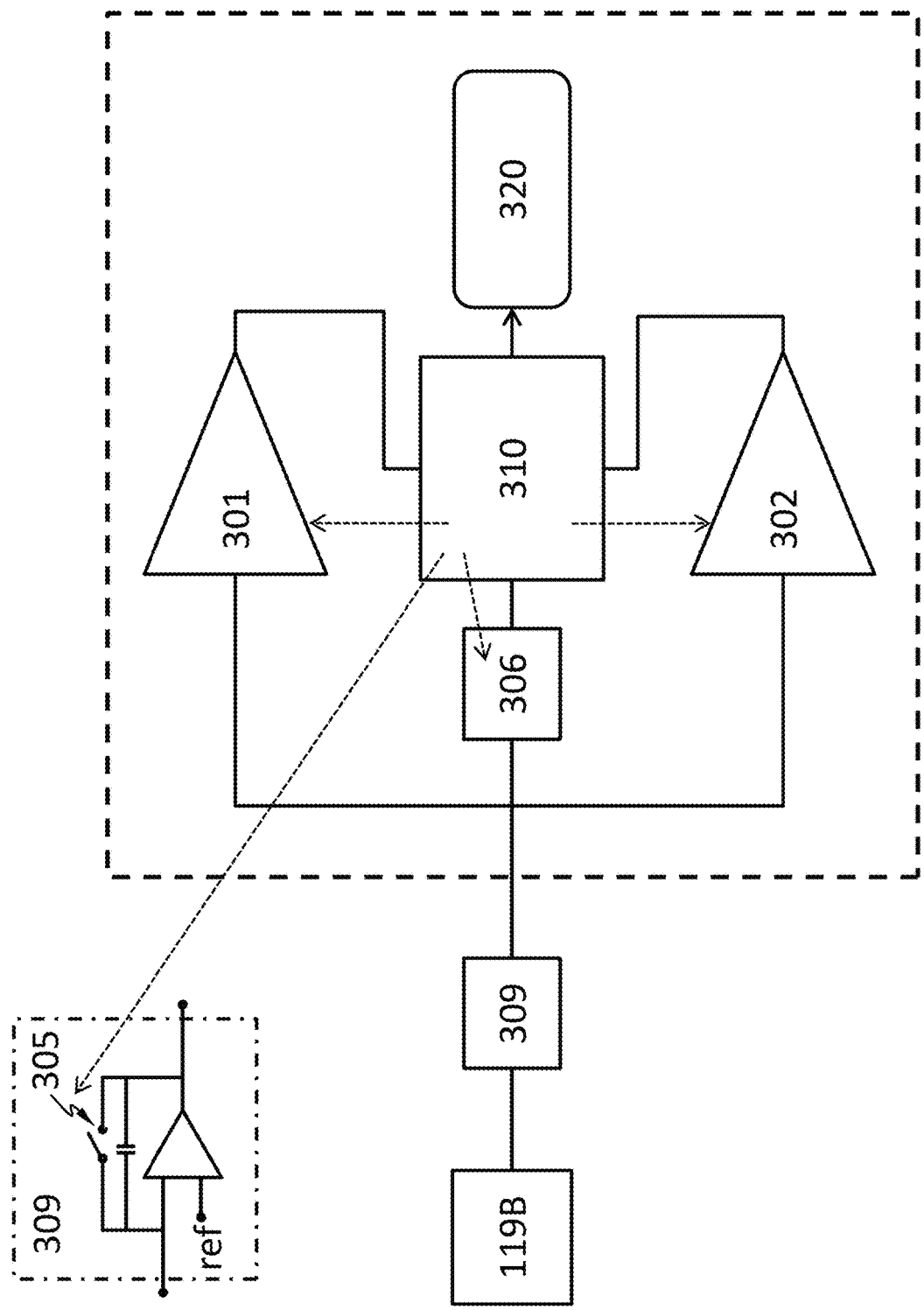
FIG. 3A and FIG. 3B each show a component diagram of an electronic system of the X-ray detector in FIG. 1A or FIG. 1B, according to an embodiment.
Figure 3B:
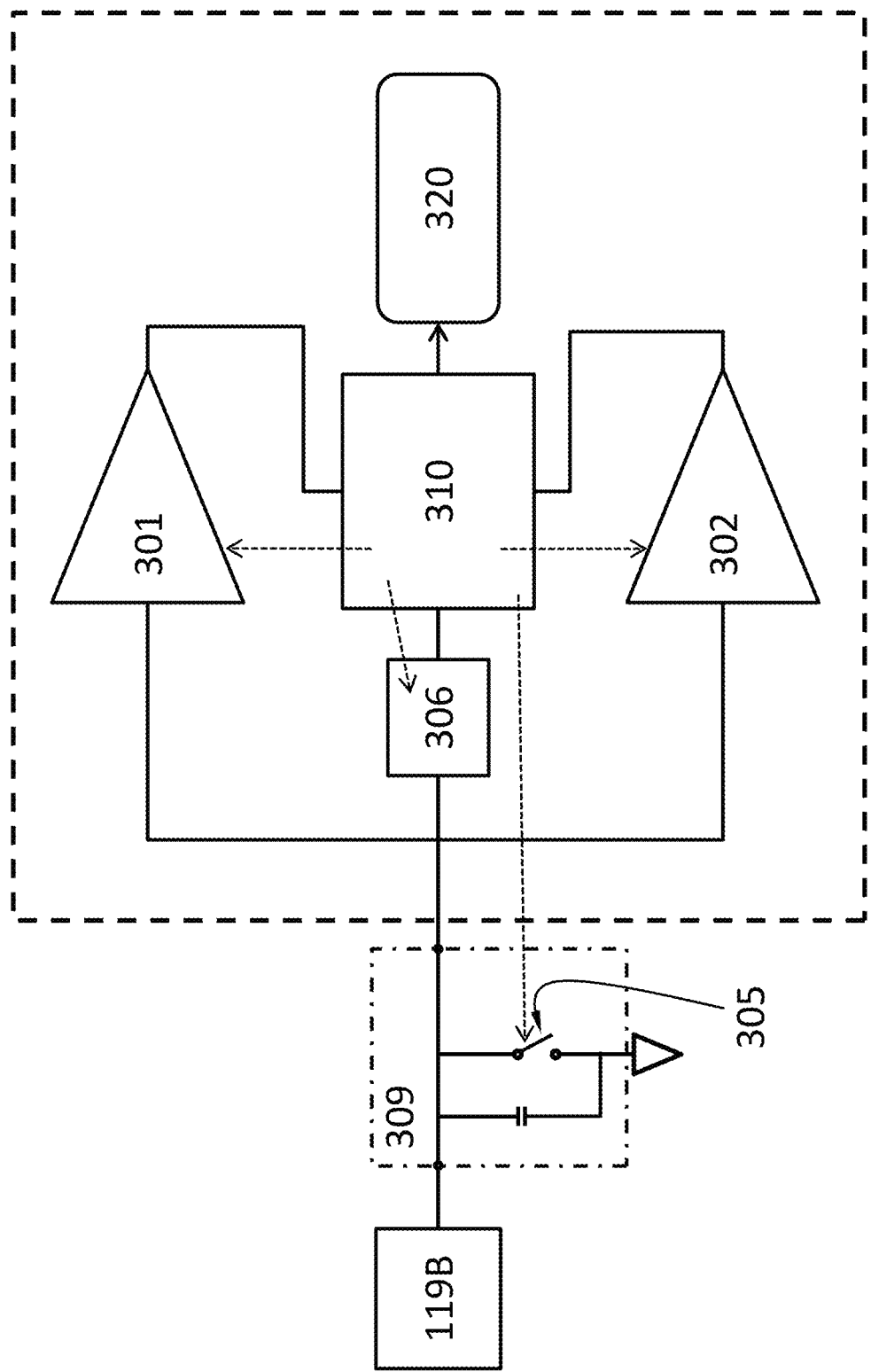

FIG. 3A and FIG. 3B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of at least one of the electrical contacts 119B to a first threshold. The first voltage comparator 301 may be configured to monitor the voltage directly, or calculate the voltage by integrating an electric current flowing through the at least one of the electrical contacts 119B over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident X-ray photon. The first voltage comparator 301 configured as a continuous comparator is especially suitable when the incident X-ray intensity is relatively high. The first voltage comparator 301 may be a clocked comparator, which has the benefit of lower power consumption. The first voltage comparator 301 configured as a clocked comparator may cause the system 121 to miss signals generated by some incident X-ray photons. When the incident X-ray intensity is low, the chance of missing an incident X-ray photon is low because the time interval between two successive photons is relatively long. Therefore, the first voltage comparator 301 configured as a clocked comparator is especially suitable when the incident X-ray intensity is relatively low. The first threshold may be 5-10%, 10%-20%, 20-30%, 30-40% or 40-50% of the maximum voltage one incident X-ray photon may generate on the at least one of the electrical contacts 119B. The maximum voltage may depend on the energy of the incident X-ray photon (i.e., the wavelength of the incident X-ray), the material of the X-ray absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the at least one of the electrical contacts 119B over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{ if } x \geq 0 \\ -x, \text{ if } x \leq 0 \end{cases}.$$

The second threshold may be 200%-300% of the first threshold. The second threshold may be at least 50% of the maximum voltage one incident X-ray photon may generate on the at least one of the electrical contacts 119B. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident X-ray. However, having a high speed is often at the cost of power consumption.

The counter 320 is configured to register a number of X-ray photons reaching the X-ray absorption layer 110. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the at least one of the electrical contacts 119B to an electrical ground, so as to reset the voltage and discharge any charge carriers accumulated on the at least one of the electrical contacts 119B. In an embodiment, the at least one of the electrical contacts 119B is connected to an electrical ground after the expiration of the time delay. In an embodiment, the at least one of the electrical contacts 119B is connected to an electrical ground for a finite reset time period. The controller 310 may connect the at least one of the electrical contacts 119B to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 4:
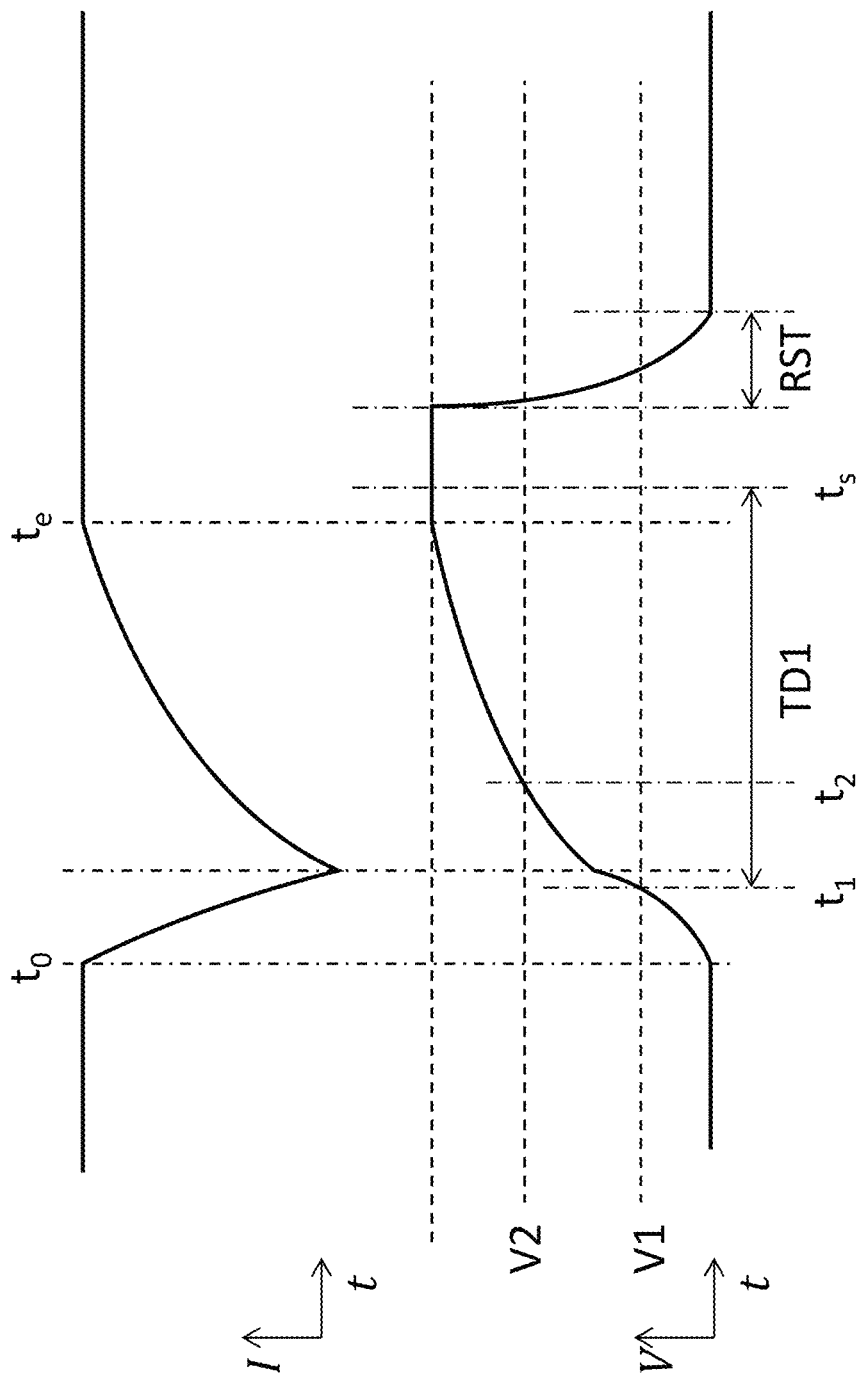
FIG. 4 schematically shows a temporal change of the electric current flowing through an electrical contact (upper curve) of an X-ray absorption layer exposed to X-ray, the electric current caused by charge carriers generated by an X-ray photon incident on the X-ray absorption layer, and a corresponding temporal change of the voltage of the electrical contact (lower curve), according to an embodiment.

The system 121 may include an integrator 309 electrically connected to the at least one of the electrical contacts 119B, wherein the integrator is configured to collect charge carriers from the at least one of the electrical contacts 119B. The integrator can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the at least one of the electrical contacts 119B accumulate on the capacitor over a period of time ("integration period") (e.g., as shown in FIG. 4, between $t_0$ to $t_1$, or $t_1$-$t_2$). After the integration period has expired, the capacitor voltage is sampled and then reset by a reset switch. The integrator can include a capacitor directly connected to the at least one of the electrical contacts 119B.

FIG. 4 schematically shows a temporal change of the electric current flowing through the at least one of the electrical contacts 119B (upper curve) caused by charge carriers generated by an X-ray photon incident on the X-ray absorption layer 110, and a corresponding temporal change of the voltage of the at least one of the electrical contacts 119B (lower curve). The voltage may be an integral of the electric current with respect to time. At time to, the X-ray photon hits the X-ray absorption layer 110, charge carriers start being generated in the X-ray absorption layer 110, electric current starts to flow through the at least one of the electrical contacts 119B, and the absolute value of the voltage of the at least one of the electrical contacts 119B starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the X-ray photon drift out of the X-ray absorption layer 110. At time $t_s$, the time delay TD1 expires. In the example of FIG. 4, time $t_s$ is after time $t_e$; namely TD1 expires after all charge carriers generated by the X-ray photon drift out of the X-ray absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by an X-ray photon, which relates to the energy of the X-ray photon. The controller 310 may be configured to determine the energy of the X-ray photon based on voltage the voltmeter 306 measures. One way to determine the energy is by binning the voltage. The counter 320 may have a sub-counter for each bin. When the controller 310 determines that the energy of the X-ray photon falls in a bin, the controller 310 may cause the number registered in the sub-counter for that bin to increase by one. Therefore, the system 121 may be able to detect an X-ray image and may be able to resolve X-ray photon energies of each X-ray photon.

After TD1 expires, the controller 310 connects the at least one of the electrical contacts 119B to an electric ground for a reset period RST to allow charge carriers accumulated on the at least one of the electrical contacts 119B to flow to the ground and reset the voltage. After RST, the system 121 is ready to detect another incident X-ray photon. Implicitly, the rate of incident X-ray photons the system 121 can handle in the example of FIG. 4 is limited by 1/(TD1+RST). If the first voltage comparator 301 has been deactivated, the controller 310 can activate it at any time before RST expires. If the controller 310 has been deactivated, it may be activated before RST expires.

Figure 5:
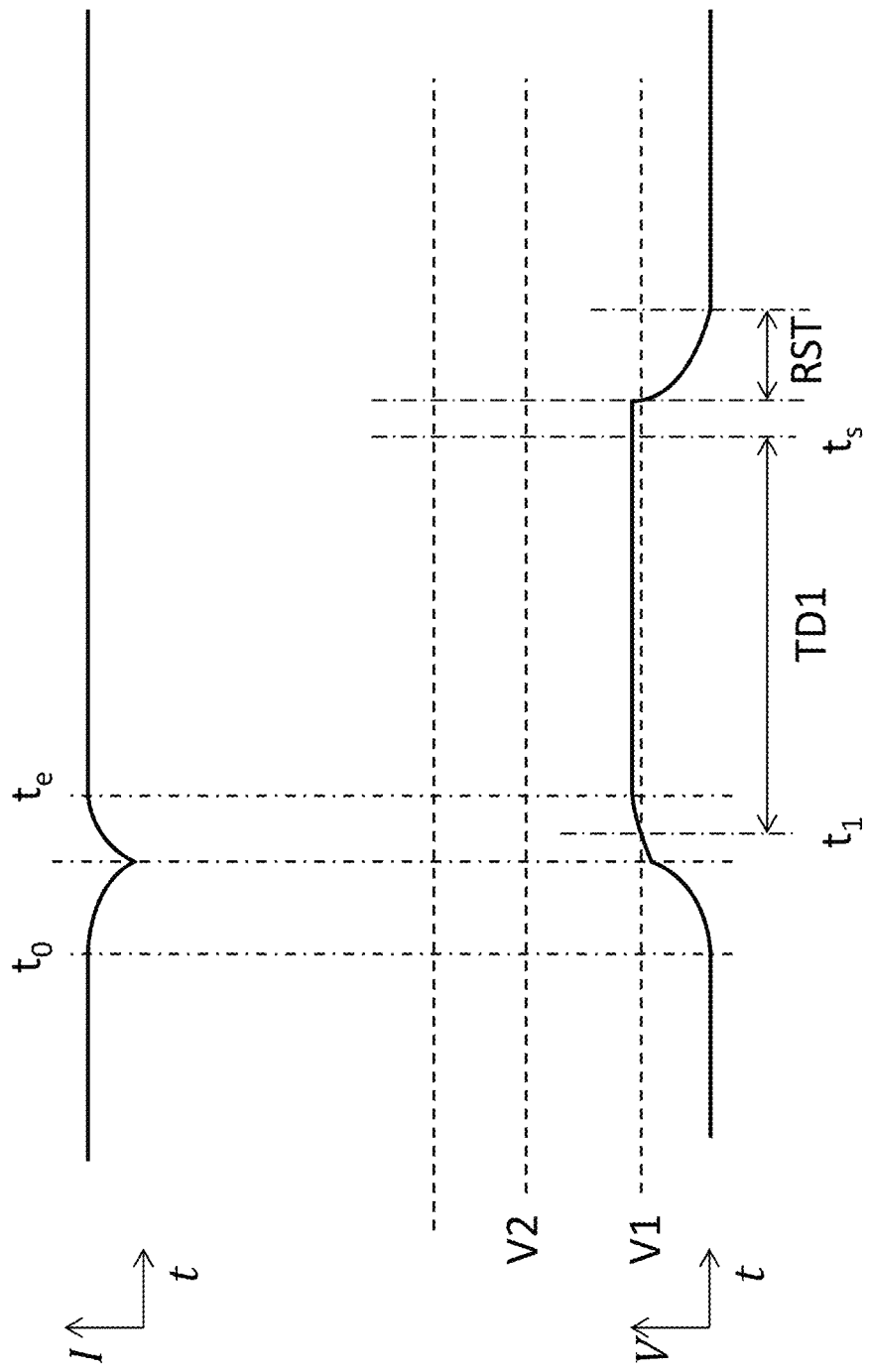
FIG. 5 schematically shows a temporal change of the electric current flowing through the electrical contact (upper curve) caused by noise (e.g., dark current), and a corresponding temporal change of the voltage of the electrical contact (lower curve), in the electronic system operating in the way shown in FIG. 4, according to an embodiment.

FIG. 5 schematically shows a temporal change of the electric current flowing through the at least one of the electrical contacts 119B (upper curve) caused by noise (e.g., dark current, background radiation, scattered X-rays, shared charges from adjacent pixels), and a corresponding temporal change of the voltage of the at least one of the electrical contacts 119B (lower curve), in the system 121 operating in the way shown in FIG. 4. At time to, the noise begins. If the noise is not large enough to cause the absolute value of the voltage to exceed the absolute value of V1, the controller 310 does not activate the second voltage comparator 302. If the noise is large enough to cause the absolute value of the voltage to exceed the absolute value of V1 at time $t_1$ as determined by the first voltage comparator 301, the controller 310 starts the time delay TD1 and the controller 310 may deactivate the first voltage comparator 301 at the beginning of TD1. During TD1 (e.g., at expiration of TD1), the controller 310 activates the second voltage comparator 302. The noise is very unlikely large enough to cause the absolute value of the voltage to exceed the absolute value of V2 during TD1. Therefore, the controller 310 does not cause the number registered by the counter 320 to increase. At time $t_e$, the noise ends. At time $t_s$, the time delay TD1 expires. The controller 310 may be configured to deactivate the second voltage comparator 302 at expiration of TD1. The controller 310 may be configured not to cause the voltmeter 306 to measure the voltage if the absolute value of the voltage does not exceed the absolute value of V2 during TD1. After TD1 expires, the controller 310 connects the at least one of the electrical contacts 119B to an electric ground for a reset period RST to allow charge carriers accumulated on the at least one of the electrical contacts 119B as a result of the noise to flow to the ground and reset the voltage. Therefore, the system 121 may be very effective in noise rejection.

Figure 6:
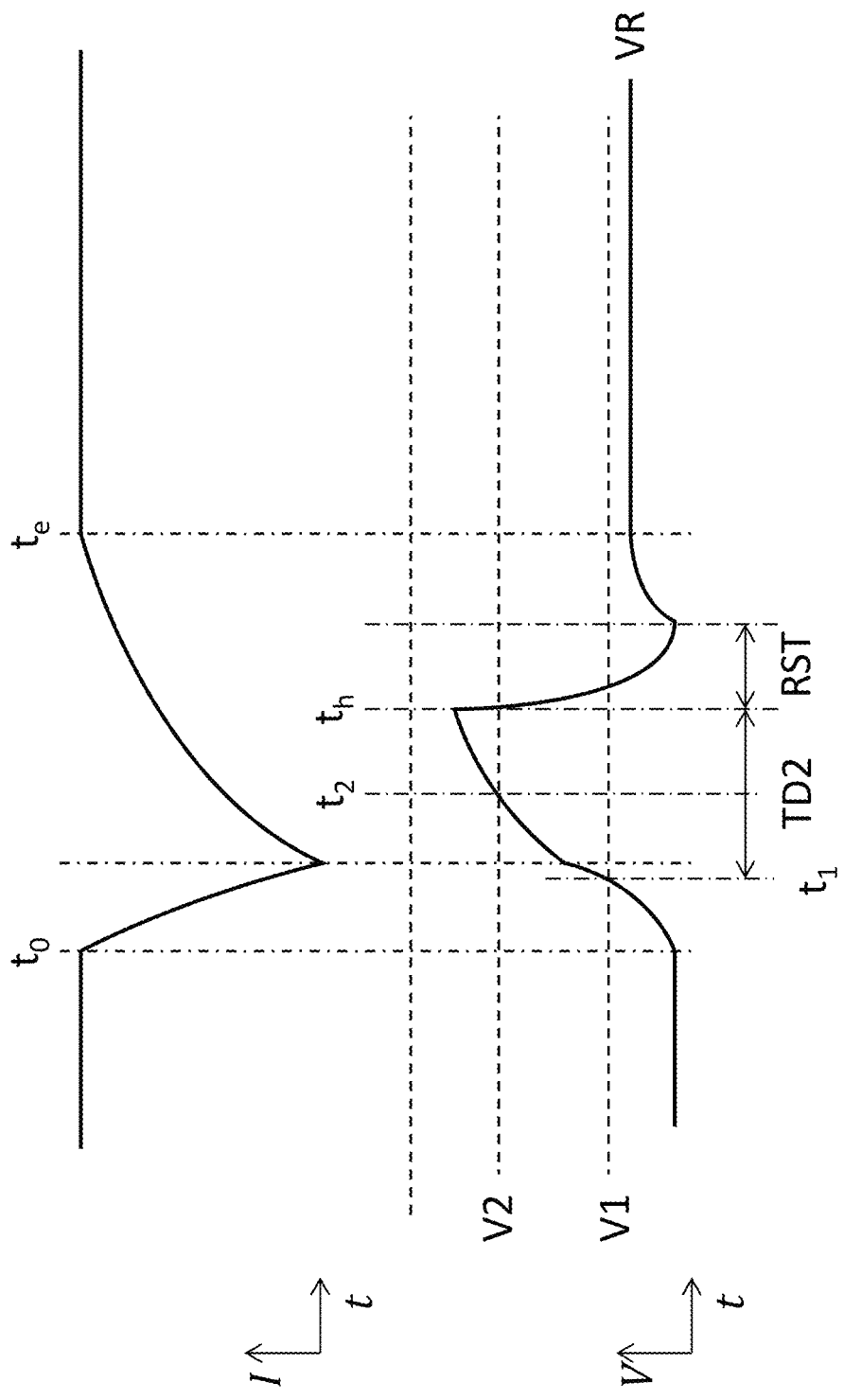
FIG. 6 schematically shows a temporal change of the electric current flowing through an electrical contact (upper curve) of the X-ray absorption layer exposed to X-ray, the electric current caused by charge carriers generated by an X-ray photon incident on the X-ray absorption layer, and a corresponding temporal change of the voltage of the electrical contact (lower curve), when the electronic system operates to detect incident X-ray photons at a higher rate, according to an embodiment.

FIG. 6 schematically shows a temporal change of the electric current flowing through the at least one of the electrical contacts 119B (upper curve) caused by charge carriers generated by an X-ray photon incident on the X-ray absorption layer 110, and a corresponding temporal change of the voltage of the at least one of the electrical contacts 119B (lower curve), when the system 121 operates to detect incident X-ray photons at a rate higher than 1/(TD1+RST). The voltage may be an integral of the electric current with respect to time. At time to, the X-ray photon hits the X-ray absorption layer 110, charge carriers start being generated in the X-ray absorption layer 110, electric current starts to flow through the at least one of the electrical contacts 119B, and the absolute value of the voltage of the at least one of the electrical contacts 119B or the electrical contact starts to increase. At time $t_1$, the first voltage comparator 301 determines that the absolute value of the voltage equals or exceeds the absolute value of the first threshold V1, and the controller 310 starts a time delay TD2 shorter than TD1, and the controller 310 may deactivate the first voltage comparator 301 at the beginning of TD2. If the controller 310 is deactivated before $t_1$, the controller 310 is activated at $t_1$. During TD2 (e.g., at expiration of TD2), the controller 310 activates the second voltage comparator 302. If during TD2, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the X-ray photon drift out of the X-ray absorption layer 110. At time $t_h$, the time delay TD2 expires. In the example of FIG. 6, time $t_h$ is before time $t_e$; namely TD2 expires before all charge carriers generated by the X-ray photon drift out of the X-ray absorption layer 110. The rate of change of the voltage is thus substantially non-zero at $t_h$. The controller 310 may be configured to deactivate the second voltage comparator 302 at expiration of TD2 or at $t_2$, or any time in between.

The controller 310 may be configured to extrapolate the voltage at $t_e$ from the voltage as a function of time during TD2 and use the extrapolated voltage to determine the energy of the X-ray photon.

After TD2 expires, the controller 310 connects the at least one of the electrical contacts 119B to an electric ground for a reset period RST to allow charge carriers accumulated on the at least one of the electrical contacts 119B to flow to the ground and reset the voltage. In an embodiment, RST expires before $t_e$. The rate of change of the voltage after RST may be substantially non-zero because all charge carriers generated by the X-ray photon have not drifted out of the X-ray absorption layer 110 upon expiration of RST before $t_e$. The rate of change of the voltage becomes substantially zero after $t_e$ and the voltage stabilized to a residue voltage VR after $t_e$. In an embodiment, RST expires at or after $t_e$, and the rate of change of the voltage after RST may be substantially zero because all charge carriers generated by the X-ray photon drift out of the X-ray absorption layer 110 at $t_e$. After RST, the system 121 is ready to detect another incident X-ray photon. If the first voltage comparator 301 has been deactivated, the controller 310 can activate it at any time before RST expires. If the controller 310 has been deactivated, it may be activated before RST expires.

Figure 7:
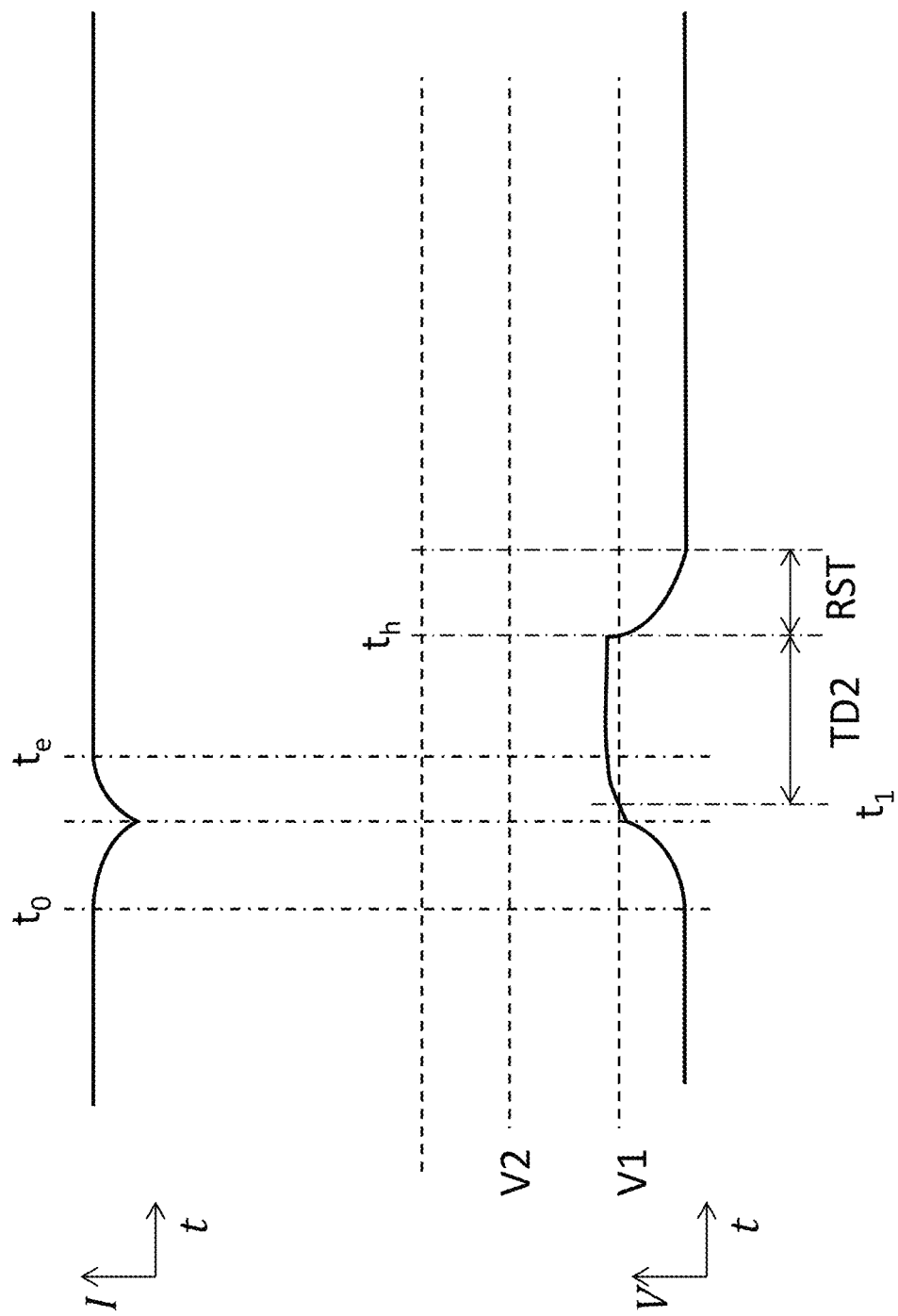
FIG. 7 schematically shows a temporal change of the electric current flowing through the electrical contact (upper curve) caused by noise (e.g., dark current), and a corresponding temporal change of the voltage of the electrical contact (lower curve), in the electronic system operating in the way shown in FIG. 6, according to an embodiment.

FIG. 7 schematically shows a temporal change of the electric current flowing through the at least one of the electrical contacts 119B (upper curve) caused by noise (e.g., dark current, background radiation, scattered X-rays, shared charges from adjacent pixels), and a corresponding temporal change of the voltage of the at least one of the electrical contacts 119B (lower curve), in the system 121 operating in the way shown in FIG. 6. At time $t_0$, the noise begins. If the noise is not large enough to cause the absolute value of the voltage to exceed the absolute value of V1, the controller 310 does not activate the second voltage comparator 302. If the noise is large enough to cause the absolute value of the voltage to exceed the absolute value of V1 at time $t_1$ as determined by the first voltage comparator 301, the controller 310 starts the time delay TD2 and the controller 310 may deactivate the first voltage comparator 301 at the beginning of TD2. During TD2 (e.g., at expiration of TD2), the controller 310 activates the second voltage comparator 302. The noise is very unlikely large enough to cause the absolute value of the voltage to exceed the absolute value of V2 during TD2. Therefore, the controller 310 does not cause the number registered by the counter 320 to increase. At time $t_e$, the noise ends. At time $t_h$, the time delay TD2 expires. The controller 310 may be configured to deactivate the second voltage comparator 302 at expiration of TD2. After TD2 expires, the controller 310 connects the at least one of the electrical contacts 119B to an electric ground for a reset period RST to allow charge carriers accumulated on the at least one of the electrical contacts 119B as a result of the noise to flow to the ground and reset the voltage. Therefore, the system 121 may be very effective in noise rejection.

Figure 8:
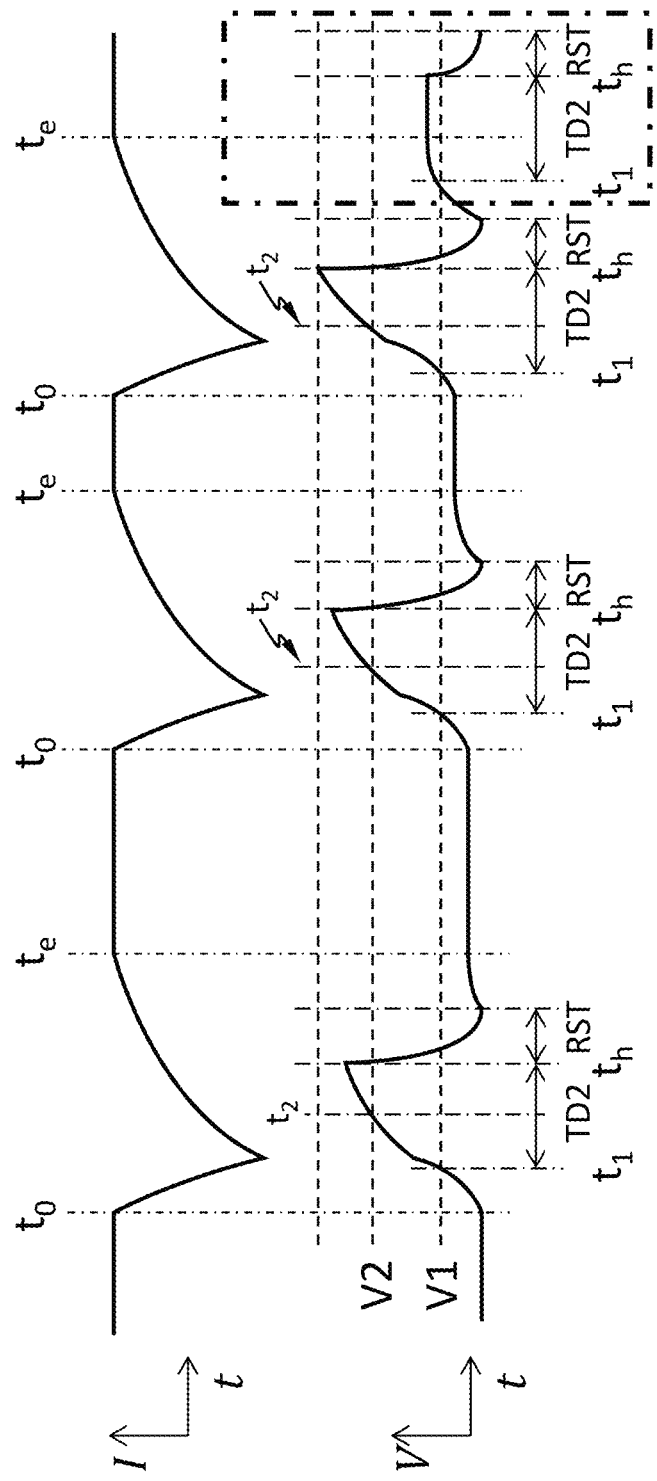
FIG. 8 schematically shows a temporal change of the electric current flowing through the electrical contact (upper curve) caused by charge carriers generated by a series of X-ray photons incident on the X-ray absorption layer, and a corresponding temporal change of the voltage of the electrical contact, in the electronic system operating in the way shown in FIG. 6 with RST expires before $t_e$, according to an embodiment.

FIG. 8 schematically shows a temporal change of the electric current flowing through the at least one of the electrical contacts 119B (upper curve) caused by charge carriers generated by a series of X-ray photons incident on the X-ray absorption layer 110, and a corresponding temporal change of the voltage of the at least one of the electrical contacts 119B (lower curve), in the system 121 operating in the way shown in FIG. 6 with RST expires before $t_e$. The voltage curve caused by charge carriers generated by each incident X-ray photon is offset by the residue voltage before that photon. The absolute value of the residue voltage successively increases with each incident photon. When the absolute value of the residue voltage exceeds V1 (see the dotted rectangle in FIG. 8), the controller starts the time delay TD2 and the controller 310 may deactivate the first voltage comparator 301 at the beginning of TD2. If no other X-ray photon incidence on the X-ray absorption layer 110 during TD2, the controller connects the at least one of the electrical contacts 119B to the electrical ground during the reset time period RST at the end of TD2, thereby resetting the residue voltage. The residue voltage thus does not cause an increase of the number registered by the counter 320.

Figure 9A:
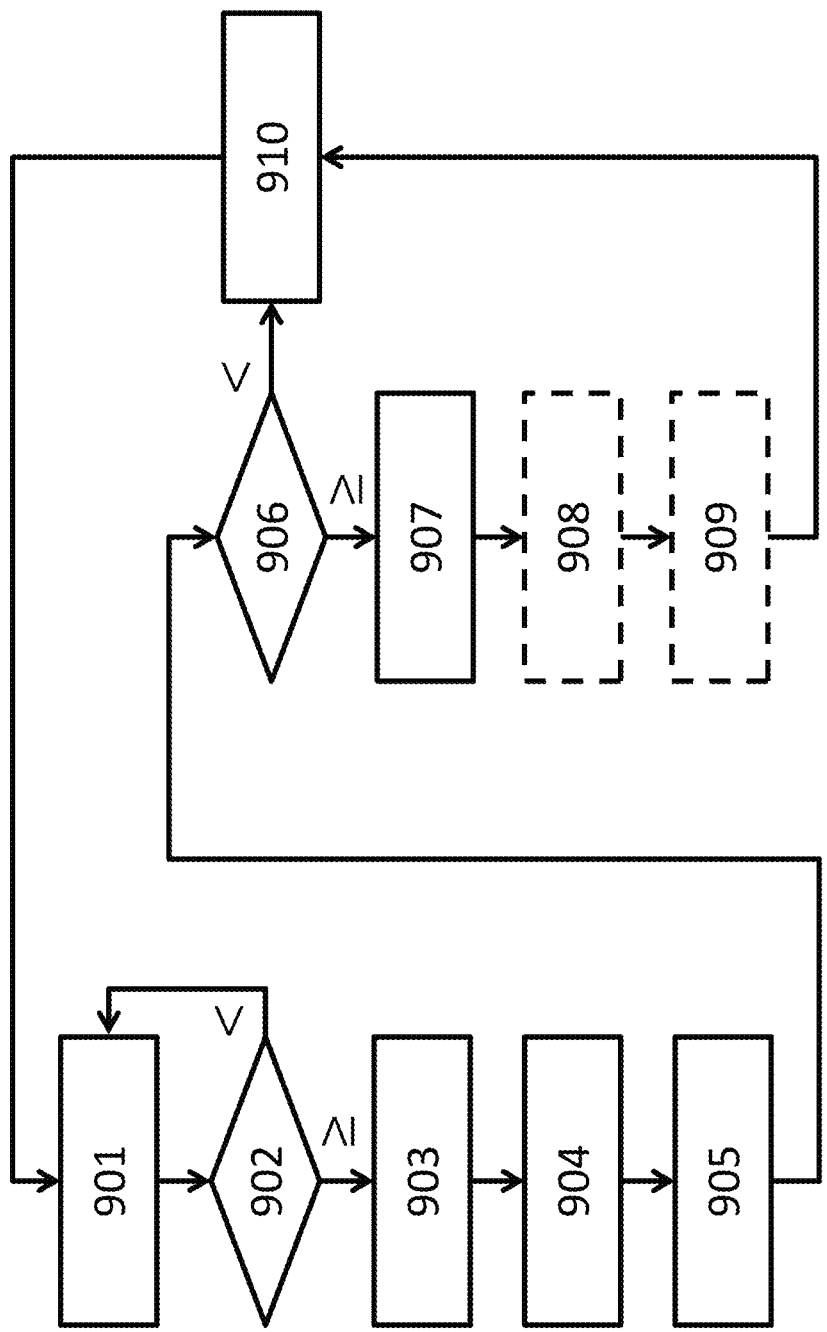
FIG. 9A shows a flow chart for a method suitable for detecting X-ray using a system such as the electronic system operating as shown in FIG. 4, according to an embodiment.

FIG. 9A shows a flow chart for a method suitable for detecting X-ray using a system such as the system 121 operating as shown in FIG. 4. In step 901, compare, e.g., using the first voltage comparator 301, a voltage of at least one of the electrical contacts 119B, to the first threshold. In step 902, determine, e.g., with the controller 310, whether the absolute value of the voltage equals or exceeds the absolute value of the first threshold V1. If the absolute value of the voltage does not equal or exceed the absolute value of the first threshold, the method goes back to step 901. If the absolute value of the voltage equals or exceeds the absolute value of the first threshold, continue to step 903. In step 903, start, e.g., using the controller 310, the time delay TD1. In step 904, activate, e.g., using the controller 310, a circuit (e.g., the second voltage comparator 302 or the counter 320) during the time delay TD1 (e.g., at the expiration of TD1). In step 905, compare, e.g., using the second voltage comparator 302, the voltage to the second threshold. In step 906, determine, e.g., using the controller 310, whether the absolute value of the voltage equals or exceeds the absolute value of the second threshold V2. If the absolute value of the voltage does not equal or exceed the absolute value of the second threshold, the method goes to step 910. If the absolute value of the voltage equals or exceeds the absolute value of the second threshold, continue to step 907. In step 907, cause, e.g., using the controller 310, the number registered in the counter 320 to increase by one. In optional step 908, measure, e.g., using the voltmeter 306, the voltage upon expiration of the time delay TD1. In optional step 909, determine, e.g., using the controller 310, the X-ray photon energy based the voltage measured in step 908. There may be a counter for each of the energy bins. After measuring the X-ray photon energy, the counter for the bin to which the photon energy belongs can be increased by one. The method goes to step 910 after step 909. In step 910, reset the voltage to an electrical ground, e.g., by connecting the at least one of the electrical contacts 119B to an electrical ground. Steps 908 and 909 may be omitted, for example, when neighboring pixels share a large portion (e.g., >30%) of charge carriers generated from a single photon.

Figure 9B:
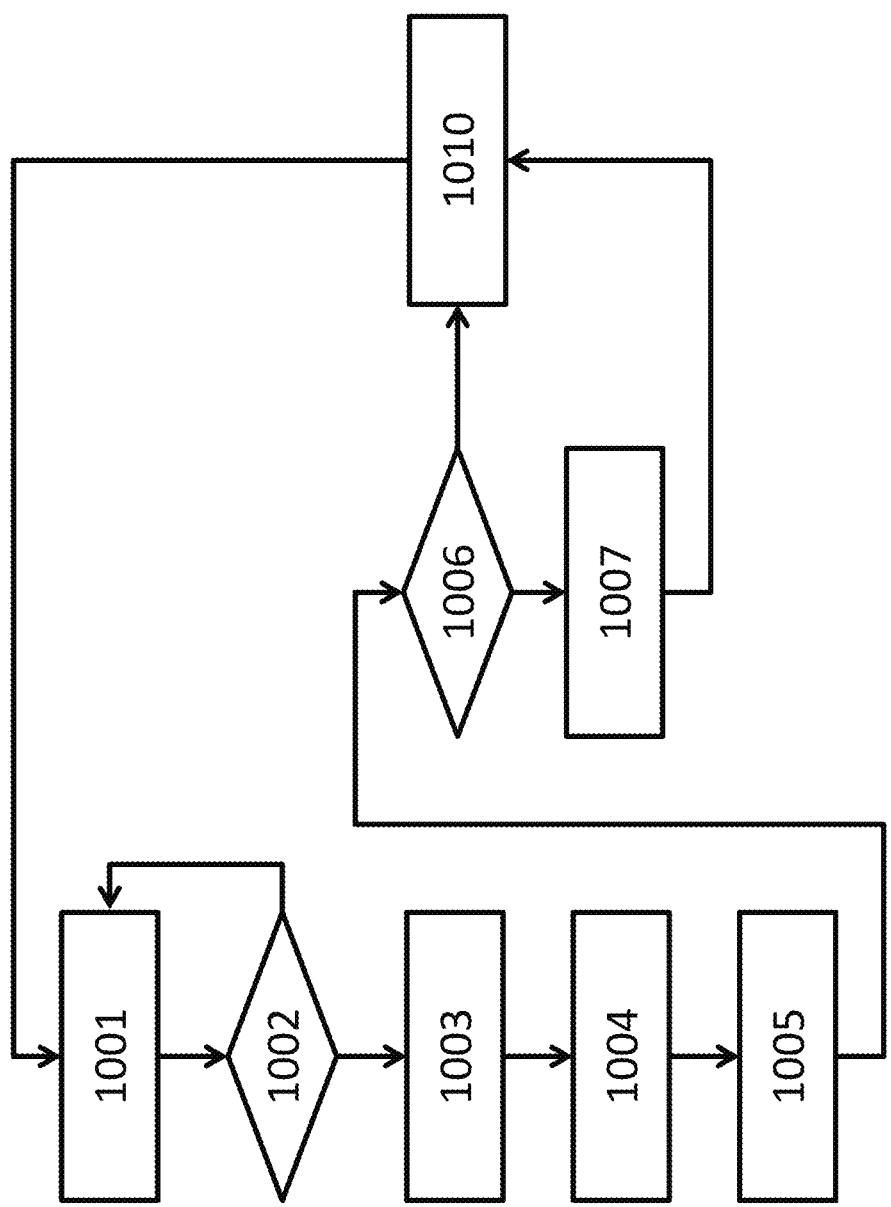
FIG. 9B shows a flow chart for a method suitable for detecting X-ray using a system such as the electronic system operating as shown in FIG. 6, according to an embodiment.

FIG. 9B shows a flow chart for a method suitable for detecting X-ray using the system such as the system 121 operating as shown in FIG. 6. In step 1001, compare, e.g., using the first voltage comparator 301, a voltage of at least one of the electrical contacts 119B, to the first threshold. In step 1002, determine, e.g., with the controller 310, whether the absolute value of the voltage equals or exceeds the absolute value of the first threshold V1. If the absolute value of the voltage does not equal or exceed the absolute value of the first threshold, the method goes back to step 1001. If the absolute value of the voltage equals or exceeds the absolute value of the first threshold, continue to step 1003. In step 1003, start, e.g., using the controller 310, the time delay TD2. In step 1004, activate, e.g., using the controller 310, a circuit (e.g., the second voltage comparator 302 or the counter 320) during the time delay TD2 (e.g., at the expiration of TD2). In step 1005, compare, e.g., using the second voltage comparator 302, the voltage to the second threshold. In step 1006, determine, e.g., using the controller 310, whether the absolute value of the voltage equals or exceeds the absolute value of the second threshold V2. If the absolute value of the voltage does not equal or exceed the absolute value of the second threshold, the method goes to step 1010. If the absolute value of the voltage equals or exceeds the absolute value of the second threshold, continue to step 1007. In step 1007, cause, e.g., using the controller 310, the number registered in the counter 320 to increase by one. The method goes to step 1010 after step 1007. In step 1010, reset the voltage to an electrical ground, e.g., by connecting the at least one of the electrical contacts 119B to an electrical ground.

Figure 10A:
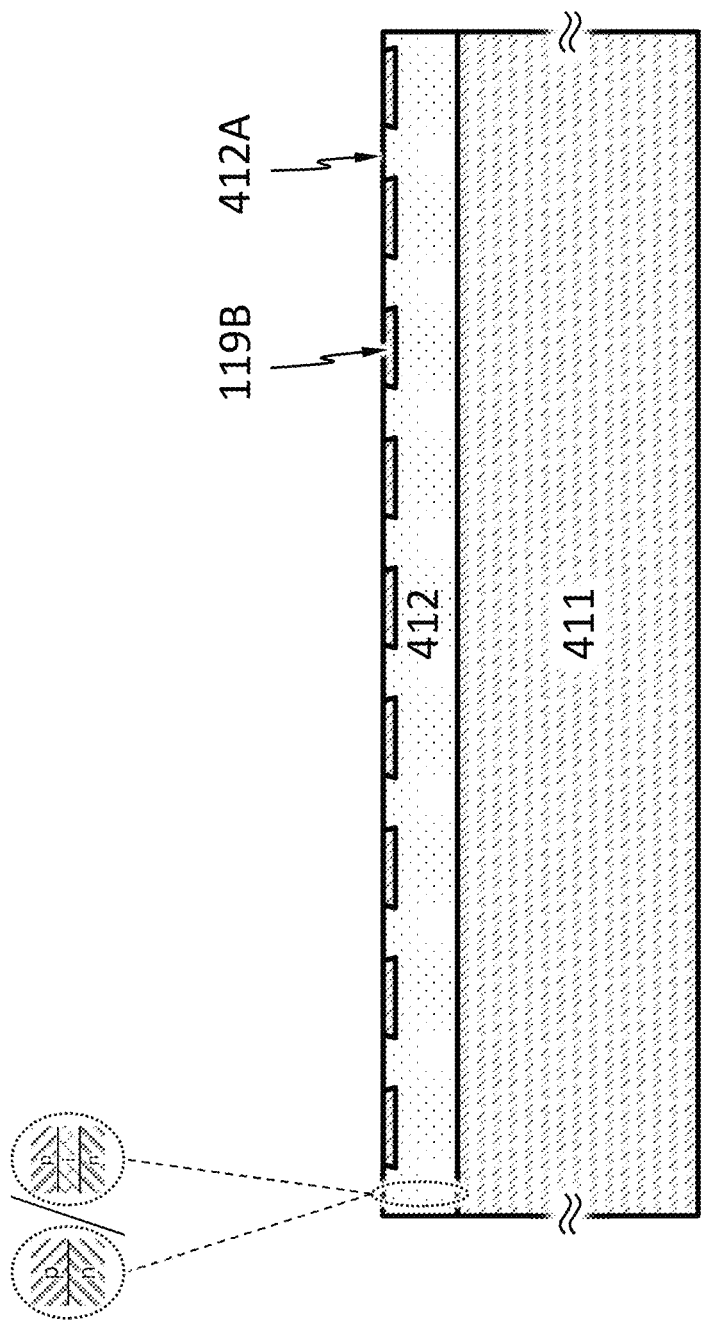
Figure 10C:
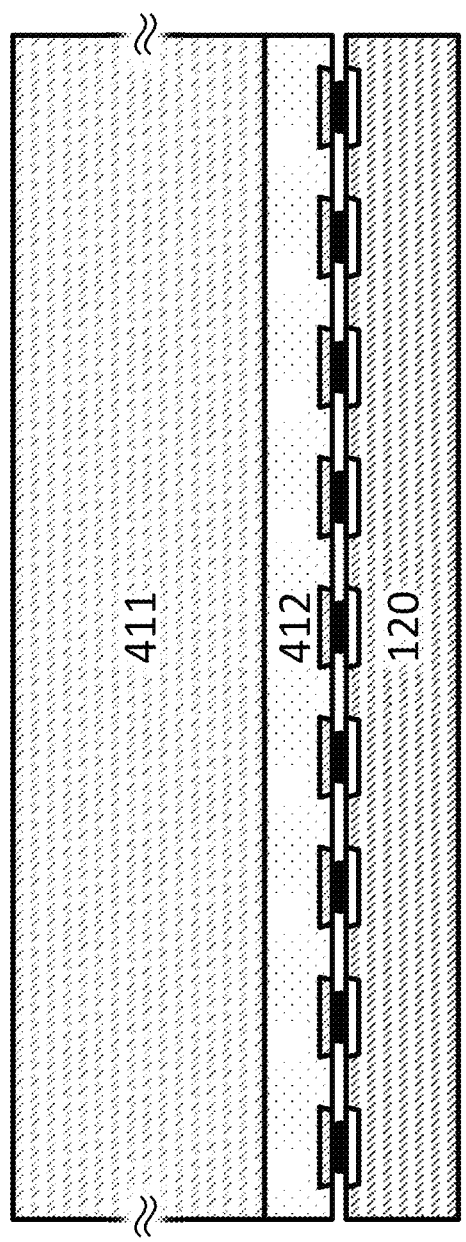
Figure 10F:
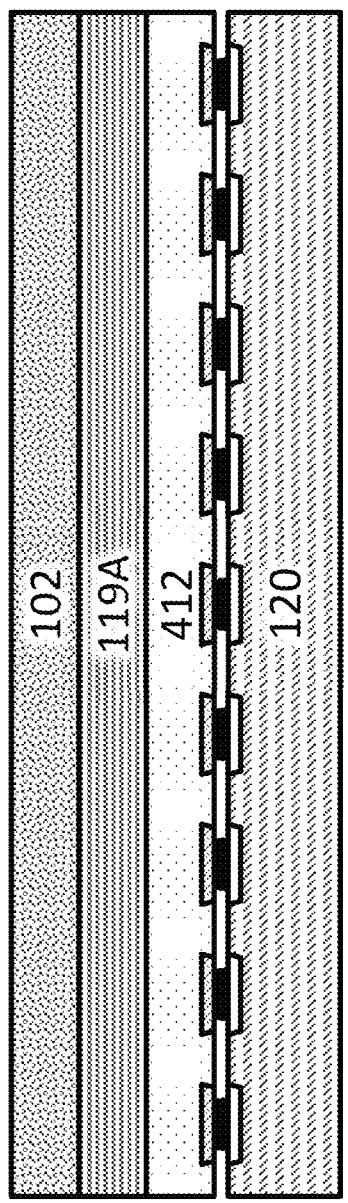

FIG. 10A-FIG. 10F schematically show a method of making the X-ray detector 100 according to an embodiment. The method starts with forming electrical contacts 119B on a first surface 412A of an epitaxial layer 412 supported on a substrate 411, as shown in FIG. 10A. The epitaxial layer 412 is the X-ray absorption layer 110 or a part thereof. The first surface 412A is opposite from the substrate 411. In one embodiment, the substrate 411 may be a semiconductor substrate such as a silicon substrate. The substrate 411 may be an intrinsic semiconductor or very lightly doped semiconductor. The substrate 411 may have a sufficient thickness to provide mechanical support for the epitaxial layer 412 during the manufacturing process. The epitaxial layer 412 may include a p-n junction or a p-i-n junction. The junction may be parallel to the substrate 411. The method may include growing the epitaxial layer 412 onto the substrate 411. The method may include forming the p-n junction or p-i-n junction during growth of the epitaxial layer 412. As shown in FIG. 10B and FIG. 10C, the epitaxial layer 412 is bonded to the electronics layer 120. After bonding, the first surface 412A of the epitaxial layer 412 faces the electronics layer 120 and the electrical contacts 119B on the first surface 412A are bonded to electrical contacts 120X of the electronics layer 120. As shown in FIG. 10D, a second surface 412B of the epitaxial layer 412 is exposed by removing the substrate 411. Removal of the substrate 411 may be performed by a suitable known or future developed method of thinning semiconductor wafers, such as, but not limited to, mechanical grinding, chemical mechanical polishing (CMP), wet etching and dry chemical etching (DCE). As shown in FIG. 10E, a common electrode 119A is formed on the second surface 412B. The common electrode 119A may be formed by depositing a grid of conductive material, such as, but not limited to, silver (Ag) nanowire, carbon nanotube (CNT), carbon, graphite, graphene or any of their combination. As shown in FIG. 10F, optionally the scintillator layer 102 is formed on the common electrode 119A. The scintillator layer 102 is opposite from the epitaxial layer 412.

Figure 11:
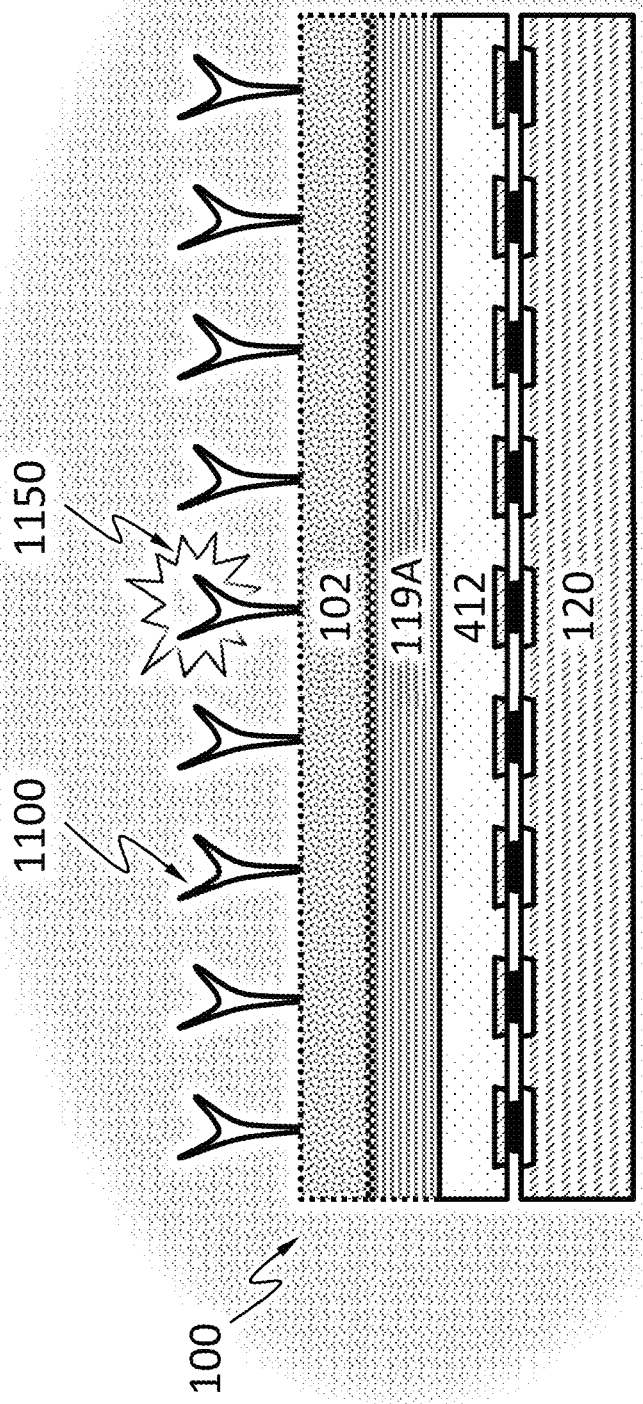
FIG. 11 schematically shows that the X-ray detector may be used to analyze a sample attached to it, according to an embodiment.

The X-ray detector 100 may be used to analyze a sample attached to it. In the example schematically shown in FIG. 11, an analyte 1100 may be disposed onto the X-ray detector 100; the analyte 1100 is caused to emit X-ray fluorescence 1150; at least a portion of the X-ray fluorescence 1150 is absorbed by the epitaxial layer 412; and the X-ray fluorescence 1150 is detected (e.g., using the electronics layer 120) based on electrical signals the X-ray fluorescence 1150 generates (directly or through the scintillator layer 102 if present) in the epitaxial layer 412. The X-ray detector 100 may be immersed in a liquid such as an aqueous solution. The analyte 1100 may include a cell, a nucleic acid, a peptide, or any combination thereof. As explained above, the scintillator layer 102 is optional. The analyte 1100 may be disposed directly on the epitaxial layer 412, or directly on the scintillator layer 102. As explained above, the common electrode 119A may not cover the entirety of the epitaxial layer 412 (e.g., the common electrode 119A being a grid). The analyte 1100 may be disposed directly on the common electrode 119A.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   forming electrical contacts on a first surface of an epitaxial layer supported on a substrate, the first surface being opposite from the substrate;
   bonding the epitaxial layer to an electronics layer, wherein the first surface faces the electronics layer and the electrical contacts on the first surface are bonded to electrical contacts of the electronics layer;
   exposing a second surface opposite the first surface by removing the substrate; and
   forming a common electrode on the second surface.

2. The method of claim 1, further comprising growing the epitaxial layer onto the substrate.

3. The method of claim 2, further comprising forming a p-n junction or a p-i-n junction in the epitaxial layer during growth thereof.

4. The method of claim 1, wherein the epitaxial layer comprises a p-n junction or a p-i-n junction.

5. The method of claim 1, further comprising forming a scintillator layer on the common electrode, the scintillator layer being opposite from the epitaxial layer.

6. The method of claim 5, wherein the scintillator layer comprises porous silicon.

7. The method of claim 1, wherein the epitaxial layer has a thickness of 1-10 microns.

8. The method of claim 1, wherein the common electrode comprises a grid.

9. The method of claim 1, wherein the common electrode comprises silver (Ag) nanowires, carbon nanotubes, graphite, graphene, or any combination thereof.

10. The method of claim 1, wherein the electronics layer comprises:
    a first voltage comparator configured to compare a voltage of at least one of the electrical contacts on the first surface to a first threshold;
    a second voltage comparator configured to compare the voltage to a second threshold;
    a counter configured to register a number of X-ray photons absorbed by the epitaxial layer;
    a controller;
    wherein the controller is configured to start a time delay from a time at which the first voltage comparator determines that an absolute value of the voltage equals or exceeds an absolute value of the first threshold;
    wherein the controller is configured to activate the second voltage comparator during the time delay;
    wherein the controller is configured to cause the number registered by the counter to increase by one, upon determination by the second voltage comparator that an absolute value of the voltage equals or exceeds an absolute value of the second threshold.

11. The method of claim 10, wherein the electronics layer further comprises an integrator electrically connected to the at least one of the electrical contacts on the first surface, wherein the integrator is configured to collect charge carriers from the at least one of the electrical contacts on the first surface.

12. The method of claim 10, wherein the controller is configured to activate the second voltage comparator at a beginning or expiration of the time delay.

13. The method of claim 10, wherein the electronics layer further comprises a voltmeter, and the controller is configured to cause the voltmeter to measure the voltage upon expiration of the time delay.

14. The method of claim 13, wherein the controller is configured to determine energy of an X-ray photon based on a value of the voltage measured upon expiration of the time delay.

15. The method of claim 10, wherein the controller is configured to connect the at least one of the electrical contacts on the first surface to an electrical ground.

16. The method of claim 1, wherein the epitaxial layer comprises silicon, germanium, GaAs, CdTe, CdZnTe, or a combination thereof.

* * * * *